United States Patent [19]

Sieck et al.

[11] Patent Number: 5,407,551

[45] Date of Patent: Apr. 18, 1995

[54] PLANAR MAGNETRON SPUTTERING APPARATUS

[75] Inventors: Peter A. Sieck, Santa Rosa; Milan R. Kirs, Lafayette; Terry A. Trumbly, Pleasant Hill, all of Calif.

[73] Assignee: The BOC Group, Inc., Murray Hill, N.J.

[21] Appl. No.: 90,916

[22] Filed: Jul. 13, 1993

[51] Int. Cl.[6] .............................................. C23C 14/34
[52] U.S. Cl. .......................... 204/298.19; 204/298.09; 204/298.16; 204/192.12
[58] Field of Search .................... 204/192.12, 298.16, 204/298.17, 298.19, 298.14, 298.09

[56] References Cited

U.S. PATENT DOCUMENTS

| | | | |
|---|---|---|---|
| 3,956,093 | 5/1976 | McLeod | 204/192 |
| 4,166,018 | 8/1979 | Chapin | 204/192 R |
| 4,198,283 | 4/1980 | Class et al. | 204/298 |
| 4,426,264 | 1/1984 | Münz et al. | 204/192 R |
| 4,515,675 | 5/1985 | Kieser et al. | 204/298 |
| 4,572,776 | 2/1986 | Aichert et al. | 204/298 |
| 4,657,654 | 4/1987 | Mintz | 204/298.18 X |
| 4,834,860 | 5/1989 | Demaray et al. | 204/298.18 |
| 4,892,633 | 1/1990 | Welty | 204/298.19 X |
| 4,966,677 | 10/1990 | Aichert et al. | 204/298.21 |

OTHER PUBLICATIONS

Chapin, John S., "The Planar Magnetron," *Vacuum Technology*, pp. 37–40, (Jan. 1974).

*Primary Examiner*—Nam Nguyen
*Attorney, Agent, or Firm*—David A. Draegert; Larry R. Cassett

[57] ABSTRACT

A planar magnetron sputtering device with improved target utilization and cooling capacity is provided. The device includes a magnet yoke as the main structure of the cathode body. The magnet yoke is made of low carbon steel which provides magnetic shunt and physical strength. The target is attached to a metal backing plate so that the side surface of the target is substantially flush with the side surface of the backing plate. Suitable magnets are adapted for producing a closed-loop magnetic field over the lower surface of the target. The magnets include an outer magnet that has an annular structure positioned around an inner elongated magnet. The outer magnets are positioned along the perimeter of the backing plate and small magnets are employed to create larger active target area. The magnet yoke also comprises extension structures which are positioned along the side surface of the target. These extensions shunt the magnetic field at the edges of the target. The planar magnetron demonstrates improved target utilization and deposits more uniform films.

32 Claims, 4 Drawing Sheets

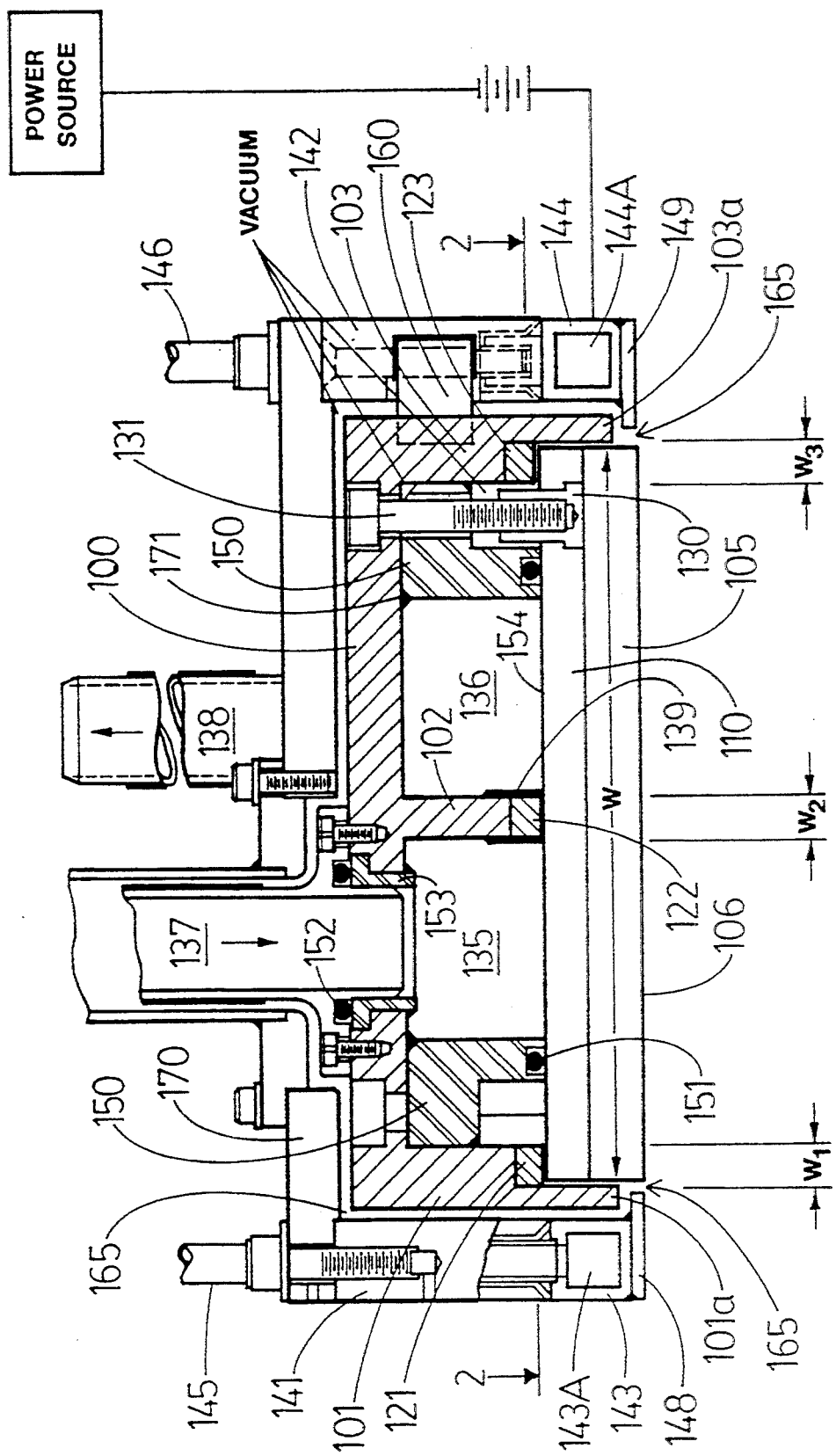
FIG._1.

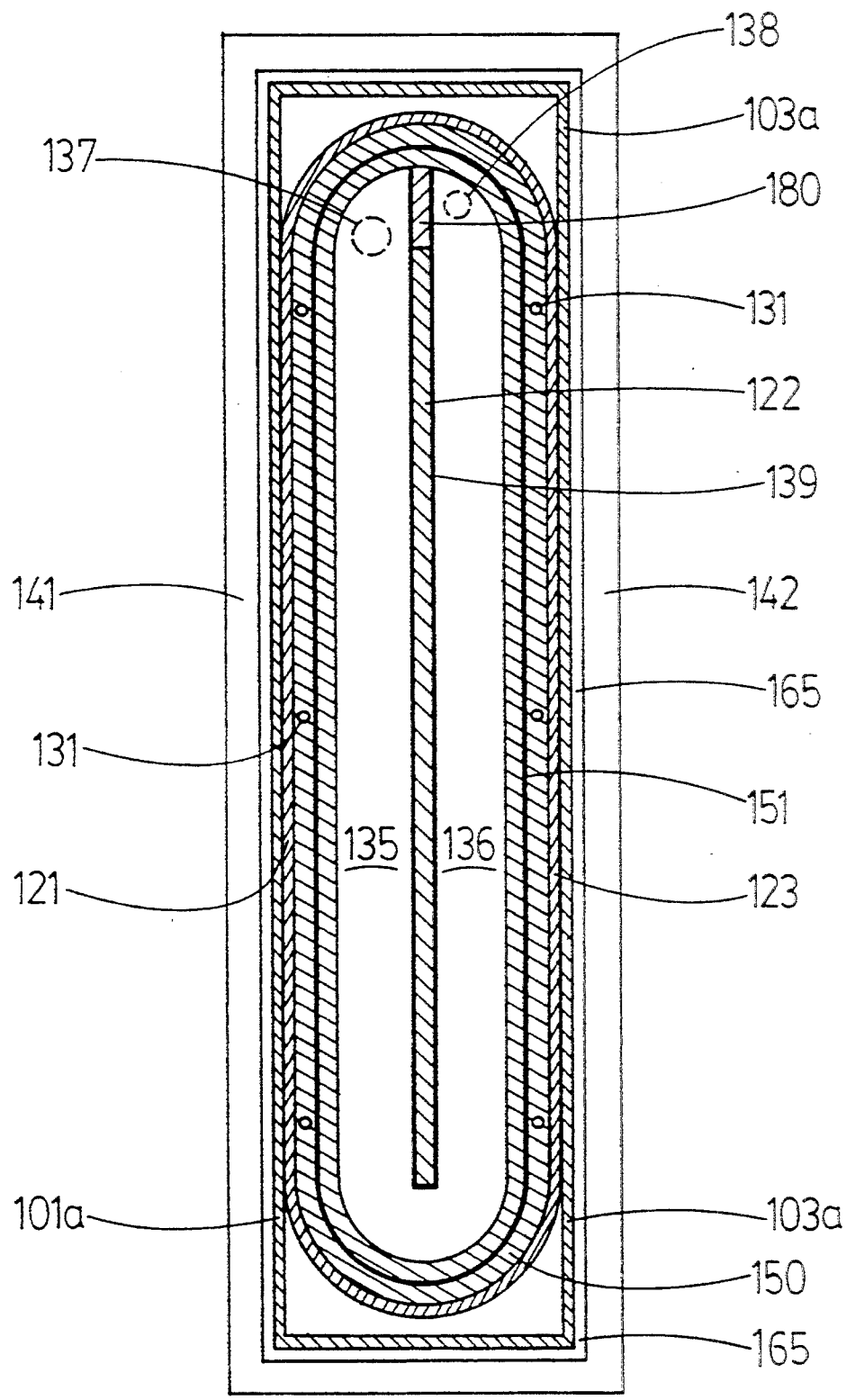
FIG._2.

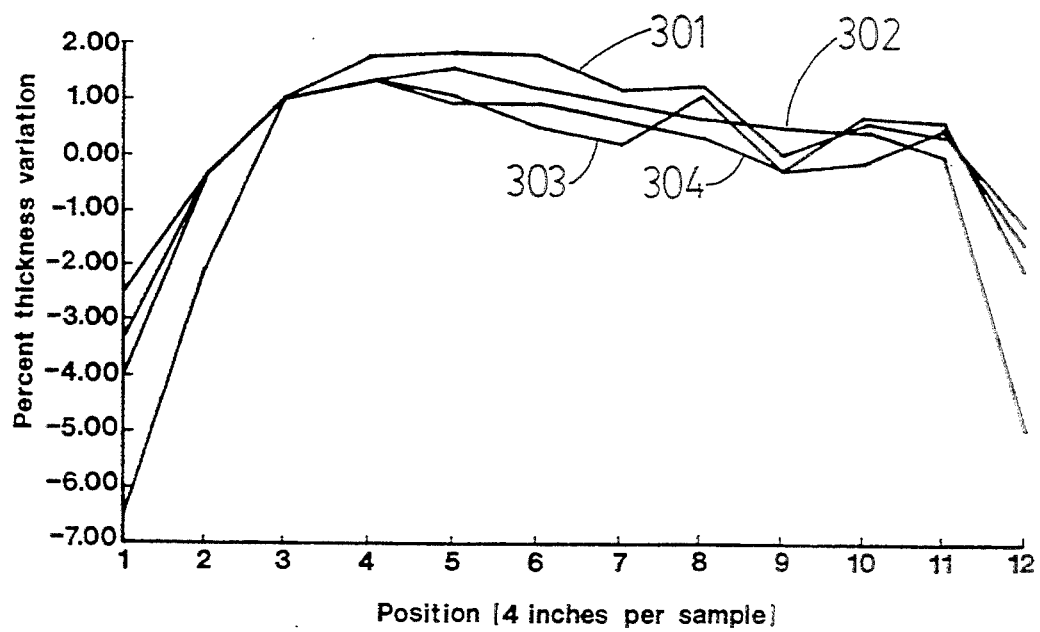
FIG._3.
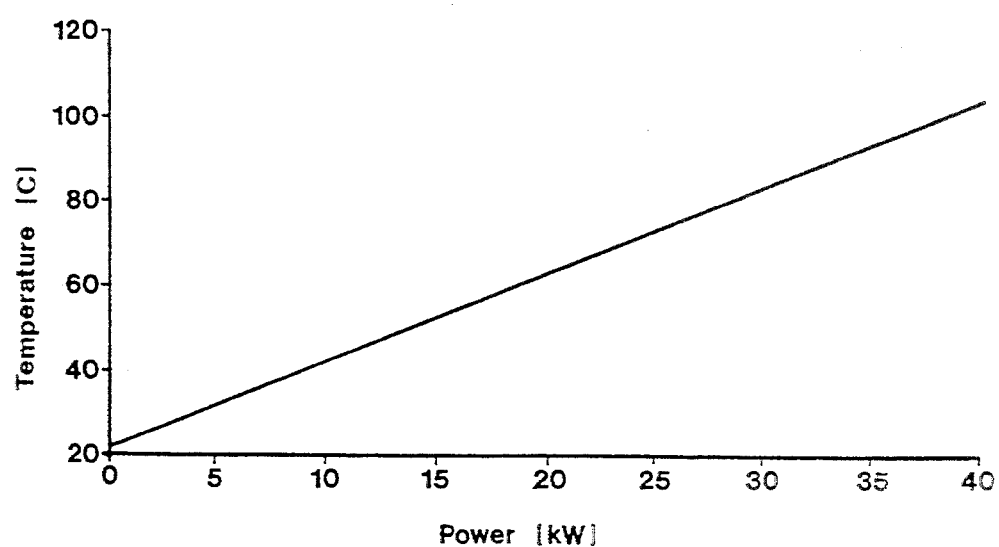
FIG._4.

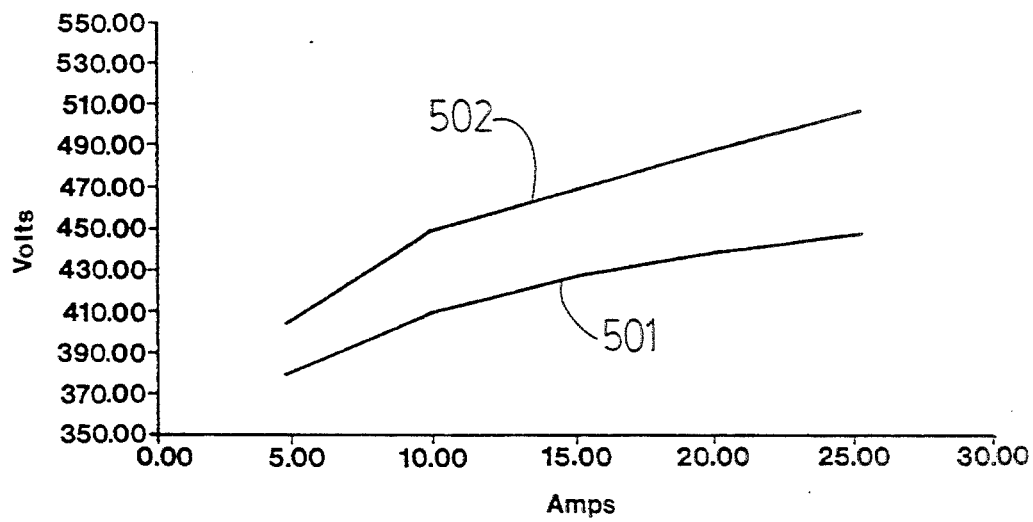
FIG._5.
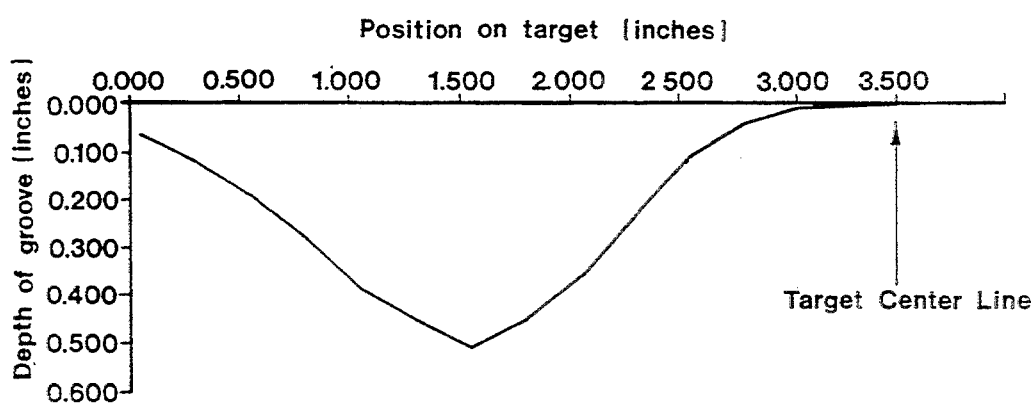
FIG._6.

PLANAR MAGNETRON SPUTTERING APPARATUS

FIELD OF THE INVENTION

The invention relates generally to an apparatus for sputtering films onto a substrate, and more particularly to a planar magnetron sputtering apparatus that demonstrates improved target utilization.

BACKGROUND OF THE INVENTION

Sputtering is the physical ejection of material from a target as a result of ion bombardment of the target. The ions are usually created by collisions between gas atoms and electrons in a glow discharge. The ions are accelerated into the target cathode by an electric field. A substrate is placed in a suitable location so that it intercepts a portion of the ejected atoms. Thus, a coating of target material is deposited on the surface of the substrate.

In an endeavor to attain increased deposition rates, magnetically enhanced targets have been used. For a planar magnetron, the cathode includes an array of permanent magnets arranged in a closed loop and mounted in a fixed position in relation to the flat target plate. Thus, the magnetic field is caused to travel in a closed loop, commonly referred to as a "race track," which establishes the path or region along which sputtering of the target material takes place. For a rectangular shaped target, the "race track" has a characteristic oval configuration wherein the erosion pattern in the target appears as a circular trough directly under the peak of the magnetic field lines. In a magnetron cathode, a magnetic field confines the glow discharge plasma and increases the path length of the electrons moving under the influence of the electric field. This results in an increase in the gas atom-electron collision probability. This leads to a much higher sputtering rate than that obtained without the use of magnetic confinement. Further, the sputtering process can be accomplished at a much lower gas pressure.

Heat generated during sputtering must be removed to insure adequate performance of the planar magnetron, but effective heat removal is often difficult to achieve in conventional planar magnetrons. This problem stems in part from the design of planar magnetrons wherein the cathode comprises a basic cathode body (or core) typically having one or two channels each of which is flanked by the sides of the core. Each channel houses permanent magnets that are connected by a magnet yoke. A planar target is positioned in proximity to the poles of the permanent magnets so that the target covers a substantial part of the channel. See, for example, Aichert et al., U.S. Pat. No. 4,572,776, issued Feb. 25, 1986. By positioning the magnets in the channel of the core, the core effectively confines most of the magnetic field to regions above the target. Unfortunately, with this design effective heat removal remains a problem.

Another problem associated with conventional planar magnetrons is low target utilization. Typically, with current large scale planar magnetrons, only about 28% of the target material is used before the entire target plate must be replaced. This is due to the fact that in present systems target material is sputtered primarily from a narrow region near the center of the "race track." This creates erosion patterns having pronounced grooves that would eventually penetrate through the target material into the support structure if the target material is not replaced in time.

SUMMARY OF THE INVENTION

It is the primary object of the present invention to provide a planar magnetron capable of improved target utility.

It is another object of the present invention to provide a planar magnetron that has a magnet yoke that includes structures for shunting the magnet field thereby obviating the need for a separate cathode core structure.

It is a further object of the present invention to provide a planar magnetron that demonstrates improved target utilization and heat dissipation.

These and other objects are achieved with the inventive planar magnetron which has a magnet yoke as the main structure of the cathode. The magnet yoke is made of low carbon steel which provides magnetic shunt and physical strength. The planar target is preferably attached to a copper backing plate that has substantially the same contour so that the side surface of the target is substantially flush with the side surface of the backing plate. Positioned adjacent to and above the backing plate are magnets configured for generating a closed-loop magnetic field over the lower surface of the target.

One feature of the invention is that the magnets comprise an inner elongated magnet and an outer annular magnet that is positioned along the edge of the backing plate. The magnet yoke has an inner projection that is positioned above the inner magnet and outer projections that are positioned above the outer magnet. The projections define primary coolant channels that are in direct thermal communication with a substantial area of the backing plate. Furthermore, the magnet yoke also comprises structures which extend along the side surface of the target for shunting the magnetic field at the edges of the target.

To facilitate heat removal, the planar magnetron includes side bars with secondary coolant channels through which coolant such as water is circulated. The side bars can function as anodes; alternatively, separate anode structures, which are attached to the side bars, can be employed. With the inventive planar magnetron, up to 36%, or more, of the target material is sputtered before the target has to be replaced. In addition, the ratio of active area to target area is greater than that of conventional planar magnetrons.

BRIEF DESCRIPTION OF THE DRAWINGS

FIG. 1 is a composite sectional view of a planar magnetron.

FIG. 2 is a plan view of the planar magnetron of FIG. 1 taken along line 2—2.

FIG. 3 is a graph illustrating the percent thickness variation of sputtered titanium film versus position along the width of a substrate.

FIG. 4 is a graph illustrating the correlation between the temperature of the water coolant and the power applied to the planar magnetron.

FIG. 5 is the current-voltage curve for the planar magnetron.

FIG. 6 is an erosion curve illustrating the erosion pattern for a titanium target.

DETAILED DESCRIPTION OF THE PREFERRED EMBODIMENTS

The present invention is based in part on the development of an improved planar magnetron that obviates the need to have separate cathode core (or basic body) and magnet yoke structures. This is accomplished by employing a magnet yoke capable of serving as a cathode and shunting the magnetic field. The improved planar magnetron affords better cathode and anode cooling and increases the active target area for a given source area. "Source area" is generally defined as the total surface area of the side of the planar target from which target material is sputtered, and "active target area" is generally defined as that part of the source area from which target material actually is sputtered. The characteristic "racetrack" on a planar magnetron is caused by the erosion of the active target area during sputtering.

FIG. 1 is a composite sectional view of one embodiment of the planar magnetron sputtering device suitable for installation in an evacuable chamber. The apparatus comprises a magnet yoke 100 as the main structure of the cathode body. The magnet yoke is made of low carbon steel which provides magnetic shunt and physical strength. Target 105, which has a lower planar surface 106, is generally rectangular and is formed from the particular material to be sputtered. Common sputtering materials include metals such as titanium and zinc. The target is generally positioned to be parallel with the surface or surfaces upon which the sputtered deposit is to be made. Thus, a substrate to be coated would be supported a short distance from the lower target planar surface 106.

The target is attached to the metal backing plate 110 that is preferably made of copper or any suitable material. Copper is preferred because it has high thermal conductivity and good mechanical properties. The upper surface of the target is bonded to the lower surface of the backing plate by soldering, brazing, using adhesives, or other bonding techniques. The lower surface of the backing plate preferably has substantially the same contour as the upper surface of the target so that the side surface of the target is substantially flush with the side surface of the backing plate. (For targets made of materials that are sufficiently strong and machinable, e.g. titanium or stainless steel, no backing plate is required.)

Positioned adjacent to and above the upper surface of the backing plate are suitable magnet means designed to generate a closed-loop magnetic field over the lower surface 106 of the target. The magnet means comprise a central elongated magnet 122 and outer magnets 121 and 123. It is understood that each magnet referred to, either 121, 122, or 123, preferably comprises a plurality of individual magnets. As will be described further below, the outer magnets 121 and 123 form a continuous, annular shaped magnet having an exterior side that is positioned adjacent to the edge of the backing plate. For a rectangularly shaped backing plate, the annular outer magnet will be adjacent to only a portion of the edge along the length of the backing plate. There is a small gap of approximately 0.050 inches (0.1524 cm) between the pole of each permanent magnet (121 and 123) and the backing plate (or between the poles and target when no backing plate is needed), so that the magnet poles are essentially separated from the target surface 106 by the thickness of the target and backing plate.

The polarity of the pole (facing the backing plate) of the inner magnet 122 is opposite to the polarity of poles (facing the backing plate) of the outer magnets 121 and 123. This arrangement creates a magnetic field which emerges from the target lower surface over one pole, curves over, and reenters the target over the opposite pole. The magnetic field is caused to travel in the characteristic closed loop that defines the "race-track" from which material is sputtered. As will be shown below, with the inventive planar magnetron, the source area is larger than in a conventional planar magnetrons having a target with comparable surface area. The improved target utilization is attributable in part to the fact that width of each of the magnets 121, 122, and 123 is relatively small relative to the width of the target lower surface and that the outer magnets are positioned at the edge of the backing plate. The result is that the closed loop magnetic field covers a larger percentage of the target surface. FIG. 1 is a composite transverse sectional view of the planar magnetron and with the present invention the width of each magnet is preferably approximately 5.5% of the backing plate or target width. By transverse section is meant a transverse section taken across a middle section of a rectangular planar magnetron that includes a cross section of the elongated inner magnet. Thus the middle section of a rectangular planar magnetron includes those parts along the length of the magnetron where the upper backing plate surface (or the upper target surface, for embodiment that do not have a backing plate) supports both the inner and the outer magnets. Thus, as shown in FIG. 2, the middle section corresponds to that part of the magnetron between the ends of the elongated inner magnet.

An important aspect of the invention is that the width of each magnet should be less than approximately 6% of the target width and preferably less than approximately 5.5%. Referring to FIG. 1, if the target has width W, and magnets 121, 122, and 123 have widths $w_1$, $w_2$, and $w_3$, respectively, then $w_1$, $w_2$, and $w_3$ collectively should be equal to or less than about 0.18 W, and preferably equal to or less than about 0.165 W. For brevity, since magnets 121 and 123 comprise a single outer annual magnet, it is understood that reference to the width of the outer magnet(s) includes the widths of both magnets 121 and 123, collectively. The small width of each permanent magnet maximizes the active target area from which target material can be sputtered.

The low carbon steel yoke 100 has three projections or members. These are inner projection 102 and outer projections 101 and 103 which rest on magnets 122, 121, and 123, respectively. The backing plate 110 is secured to the yoke by a plurality of T-nuts 130 and bolts 131. The copper backing plate can be fabricated from a single, flat stock sheet with no brazing or soldering. The magnet yoke is mounted by a plurality of support ceramic rods 160 to side bars 141 and 142. The side bars are attached to a cover plate 170. The outer structures of the side bars can be releasably mounted to a vacuum chamber. As shown in FIG. 2, the side bars 141 and 142 define a continuous frame-like outer structure around the perimeter of target cathode. The side bars have elongated members 143 and 144 which define secondary coolant channels 143A and 144A, respectively, through which coolant such as water is circulated. Coolant is delivered from inlets 145 and 146 and is removed through outlets (not shown). The side bars can function as anodes, but preferably, as shown, the anodes comprise of shadow bar 148 and member 143, that are welded together, on one side of the target and shadow bar 149 and member 144 on the other. Each shadow bar comprises a metallic plate that has a lower planar surface that is substantially coplanar with target surface 106. The shadow bars prevent condensate from accumulating in the dark space 165. Elongated members 143 and 144 are each electrically isolated from the remaining upper portions of side bar 141 and 142, respectively, by ceramic insulators.

The magnet yoke also comprises extension structures 101a and 103a disposed along the side surfaces of the backing plate and target. As shown in FIG. 1, the spacing between the extension structures and the side surface of the target is only about 0.031 inch (0.08 cm). These extensions shunt the magnetic field at the edges of the target. In addition, the side bars and extension structures define a dark space 165 around the cathode wherein no plasma forms. Excess magnetic field entering the dark space can cause arcing. As is apparent, extensions 101a and 103a of the magnet yoke obviate the need for having a separate cathode core structure.

The permanent magnets can be made from any suitable material; NdFeB magnets are particularly suited. It was found that the presence of the extension structures 101a and 103a allows the NdFeB magnets to be smaller relative to conventional Alnico or ceramic magnets which in turn permits magnets 121 and 123 to be located closer to and more precisely at the edges along the length of the backing plate. Finally, the inventive device also comprises stainless steel inserts 150 and 153 which provide non-corrodible, non-magnetic sealing surfaces for gaskets 151 and 152. Insert 150 is welded to the magnet yoke as indicated by continuous vacuum tight weld joint 171.

During sputtering, water is continuously delivered through inlet conduit 137, circulated through primary channels 135 and 136, and removed through outlet conduit 138. The coolant removes heat that is generated during sputtering. Corrosion of the magnets is minimized by the dual-purpose rubber seal 139 which is capped over the central magnet 122. This cap also prevents coolant in channel 135 from mixing with coolant in channel 136. Corrosion of the magnet yoke is minimized by nickel plating the side surfaces of the primary coolant channels.

As shown in FIG. 2, which is a view along the 2—2 line of FIG. 1, inner magnet 122 is an elongated structure that is centrally located (with respect to the outer annular magnet) and is lined by seal 139. Insert 180 is positioned juxtaposed to one end of the inner magnet. Coolant from inlet 137 enters channel 135 at a point near insert 180 and exits through outlet 138 that is located near the other side of the insert. Thus insert 180 directs the flow of the coolant and prevents cold coolant from mixing with hot coolant. Stainless steel insert 150 defines an annular structure positioned around insert 180 and the inner magnet; moreover, insert 150 and the inner magnet and insert 180 define primary coolant channels 135 and 136. Gasket 151 which is positioned in a groove defined by insert 150 prevents coolant from leaking into the vacuum chamber. As shown in FIG. 1, bolt 131, which fit into holes in insert 150 secure the backing plate to the magnet yoke.

The outer magnet pieces 121 and 123 form an annular structure having a inner contour that matches the outer contour of insert 150 so that the magnets fit close to the insert. The annular structure of the outer magnets also define an annular space wherein the elongated inner magnet is positioned to create the closed-loop magnetic field. Extensions 101a and 103a of the yoke form a rectangular frame-like structure that is positioned along the outer perimeter of the annular magnet. Finally, side bars 141 and 142 (shown schematically) is a rectangular frame-like structure that is positioned around the outer perimeter of the extension structures.

A planar magnetron having the structures as shown in FIGS. 1 and 2 and having a titanium cathode target measuring 1 inch (2.54 cm) high, 7 inches (17.78 cm) wide, and 51 inches (129.54 cm) long was installed in an evacuable chamber. No backing plate is needed with the titanium target. In operation a negative potential sufficient to cause sputtering to occur was supplied to the target from a D.C. power source. The anodes were either grounded or floating. Argon was used as the inert gas during sputtering; the argon pressure was kept at between 1 and 5 microns. The cathode assembly was used to sputter titanium metal film onto substrates.

In one experiment in which the system operated at between approximately 20 to 25 kW power, titanium films were deposited and their thicknesses were measured at various positions along the width of the substrate. FIG. 3 is the graph of the percent thickness variation versus position along the width of the substrate for the titanium film sputtered onto a planar glass substrate. Curves 301 and 302 represent depositions wherein the anode was floated and curves 303 and 304 represent depositions wherein the anode was grounded. The graph depicts the deviation of film thickness from the average based on twelve measurements that were taken across the width of the coater. In this experiment, the substrate used was 44 inches (111.76 cm) in width and 12 glass slides were positioned approximately 4 inches apart along the width. After each substrate was coated with the titanium film, the thickness of the film on each slide was measured.

FIG. 4 is a graph illustrating the correlation between the temperature of the backing plate (measured at position 154 of FIG. 1) and the power applied to the system. As is apparent, the temperature of the backing plate increases linearly with power. The temperature of the coolant water entering the system was approximately 23° C.

FIG. 5 is a graph illustrating the correlation between current and voltage for the system. Curve 501 is the IV curve when the anodes were grounded and curve 502 is the IV curve when the anodes were floated. The power used ranged from approximately 2 to 12 kW.

FIG. 6 shows the erosion pattern for the titanium target. As is apparent, the erosion groove for only one half of the target is illustrated although it was found that the erosion groove for the other half was practically identical. Erosion of the target was measured along a transverse section of the target at approximately the mid-point along the target's length. The erosion curve shows the sputtered profile of the titanium target when the above referenced system was operated at 20 kW in argon at 2 microns pressure after approximately 200 hours. As is apparent, the broadness of the erosion pattern demonstrates that the target material was sputtered relatively evenly from across the width of the target resulting in improved target utilization.

When a target is made of material, such as indium-tin oxide (ITO), which requires that the target be attached to a backing plate, the target is normally 0.5 inches (1.27 cm) thick and the backing plate is 0.375 inches (0.9525 cm) thick. Based on the erosion characteristics for the 1 inch (2.54 cm) thick titanium plate as shown in FIG. 6, it is estimated that with the inventive planar magnetron the target utilization is at least approximately 36% for targets that require backing plates.

One important feature of the inventive device is that because the outer magnet poles are positioned at the extreme edge (or perimeter) of the backing plate, the outer boundary of the erosion region is substantially at the outer edge of the target. Moreover, the use of small magnets also allows for fine tuning of the magnet field strength along the length of the target for uniformity control. Furthermore, the relatively smaller NdFeB magnets create a relatively larger erosion region from which material is sputtered. In addition, measurements showed that the ratio of active target area to source area is approximately 0.65. (For conventional planar magnetrons that are greater than 1 meter long, this ratio is normally approximately 0.45.) The inventive planar magnetron can be operated in the A.C. mode; moreover, the apparatus can be employed in reactive sputtering wherein reactive gases are mixed with the inert gas to form film of metal compounds. For instance, the use of oxygen produces $TiO_2$ films when the target material is titanium.

It was found that the sputter efficiency, or dynamic deposition rate (DDR), for the inventive apparatus was comparable to conventional planar targets. DDR is defined by the following equation:

$$DDR(\text{Å}mm^2/Joule) = (d \cdot C \cdot S) / (P \cdot n)$$

Where:
- d = thickness of the film in angstroms
- C = racetrack length of the target in mm
- s = conveyer speed in mm per second
- P = power applied in watts
- n = number of passes Further, in the above described apparatus, a backing plate (designated as structure 110 in FIG. 1) was employed. In another embodiment of the invention, no backing plate is used so that the structures designated as 105 and 110 in FIG. 1 would instead be replaced by a single integral target. That is, instead of having two separate rectangular slabs (backing plate and target) bonded together, the second embodiment would have a single target structure without the backing plate. As is apparent, the dimensions of the target structure of the second embodiment preferably is equal to the combined dimensions of structures 105 and 110.

Although the invention has been described with preferred embodiments that have rectangular target lower (or sputtering) surfaces, the invention is applicable to planar magnetron generally including ones that have circular target surfaces.

It is to be understood that while the invention has been described above in conjunction with preferred specific embodiments, the description and examples are intended to illustrate and not limit the scope of the invention, which is defined by the scope of the appended claims.

it is claimed:

1. A planar magnetron device comprising: a sputtering target having a first target surface with a first target perimeter, a planar second target surface opposite said first target surface, and a side surface extending between said first and second surfaces; magnet means positioned adjacent to and adjoining the first target surface for generating a closed-loop magnetic field over the second target surface; and a magnet yoke having an inner projection and outer projections that define one or more primary coolant channels that are in thermal communication with a portion of the first target surface, wherein said outer projections comprise extension means that are positioned adjacent to the side surface of the target for shunting the magnetic field.

2. The planar magnetron as defined in claim 1 wherein said magnet means comprises an inner magnet and outer magnets, wherein the outer magnets are positioned adjacent to and along a portion of the first target perimeter and wherein the inner projection is attached to said inner magnet and the outer projections are attached to said outer magnets.

3. The planar magnetron as defined in claim 2 further comprising side bar structures that are positioned adjacent to the side surface of the target, and wherein said extension means and said side bar structures define a dark space therein between.

4. The planar magnetron as defined in claim 3 wherein the side bar structures define one or more secondary coolant channels.

5. The planar magnetron as defined in claim wherein the outer magnets comprise an annular structure defining an annular space and wherein the inner magnet comprises an elongated inner magnet centrally located within said annular space.

6. The planar magnetron as defined in claim 5 wherein the first target surface is rectangularly shaped having a width equal to distance W and a length, wherein the elongated inner magnet, which has a width equal to distance x1 along a transverse section of the target, is parallel with an edge of the target along the length of the target, wherein the outer magnets have a collective width equal to distance x2 along a transverse section of the target, and wherein x1 and x2 is equal to or less than about 18% of W.

7. The planar magnetron as defined in claim further comprising a pair of elongated anode structures positioned on opposite sides of the target and wherein each anode is evenly spaced from the target.

8. The planar magnetron as defined in claim 7 wherein each of the elongated anode structures defines a planar anode surface that is coplanar with said planar second target surface.

9. The planar magnetron as defined in claim 8 wherein x1 and x2 is equal to or less than about 16.5% of W.

10. The planar magnetron as defined in claim 9 wherein said magnet means comprises NdFeB magnets.

11. The planar magnetron as defined in claim 10 wherein said inner magnet is enclosed in a rubber seal means for minimizing corrosion of said inner magnet.

12. The planar magnetron as defined in claim 11 wherein said inner magnet yoke projection comprises side surfaces, wherein said side surfaces are coated with nickel for minimizing corrosion of side surfaces of inner magnet yoke projection.

13. The planar magnetron as defined in claim 12 further comprising a plurality of ceramic rod means for mounting said magnet yoke to said side bar structures.

14. The planar magnetron as defined in claim 13 further comprising one or more gasket means positioned within said outer magnet yoke projections and adjacent to said first target surface for sealing in coolant in said primary coolant channels.

15. The planar magnetron as defined in claim 14 further comprising steel insert means that are positioned within and adjacent to said outer magnet yoke projections for providing non-corrodible, non-magnetic sealing surfaces for said gasket means, and wherein said gasket means are positioned in a groove define by said insert.

16. The planar magnetron as defined in claim 15 wherein said steel insert means and said inner magnet define said primary coolant channels.

17. A planar magnetron device comprising:
a sputtering target having a first target surface that defines a first target surface contour, a planar second target surface opposite said first target surface, and a target side surface extending between said first and second surfaces, said target extending continuously within said first, second and side surfaces;
a backing plate having a first backing plate surface that defines a first backing plate surface contour, a second backing plate surface opposite said first backing plate surface, said second backing plate surface defines a second backing plate surface perimeter, and a backing plate side surface extending between said first and second backing plate surfaces, wherein said first backing plate surface is attached to said first target surface;
magnet means positioned adjacent to and adjoining the backing plate second surface for generating a closed-loop magnetic field over the planar second target surface; and
a magnet yoke having an inner projection and outer projections that define one or more primary coolant channels that are in thermal communication with a portion of the second backing plate surface, wherein said outer projections comprise extension means that are positioned adjacent to the target side surface for shunting the magnetic field.

18. The planar magnetron as defined in claim 17 wherein said magnet means comprises an inner magnet and outer magnets, wherein the outer magnets are positioned adjacent to and along at least a portion of the second backing plate surface perimeter and wherein the inner projection is attached to said inner magnet and the outer projections are attached to said outer magnets.

19. The planar magnetron as defined in claim 18 further comprising side bar structures that are positioned adjacent to the target side surface, wherein said extension means and said side bar structures define a dark space therein between.

20. The planar magnetron as defined in claim 19 wherein the side bar structures define one or more secondary coolant channels.

21. The planar magnetron as defined in claim 20 wherein the outer magnets comprise an annular structure defining an annular space and wherein the inner magnet comprises an elongated inner magnet centrally located within said annular space.

22. The planar magnetron as defined in claim 21 wherein the first backing plate surface contour matches the first target surface contour so that the target side surface is flush with the backing plate side surface.

23. The planar magnetron as defined in claim 22 wherein the second backing plate surface is rectangularly shaped having a width equal to distance W and a length, wherein the elongated inner magnet, which has a width equal to distance x1 along a transverse section of the target, is parallel with an edge of the backing plate along the length of the backing plate, wherein and outer magnets have a collective width equal to distance x2 along a transverse section of the target, and wherein x1 and x2 is equal to or less than about 18% of W.

24. The planar magnetron as defined in claim 23 further comprising a pair of elongated anode structures positioned on opposite sides of the target and wherein each anode is evenly spaced from the target.

25. The planar magnetron as defined in claim 24 wherein each of the elongated anode structures defines a planar anode surface that is coplanar with said planar second target surface.

26. The planar magnetron as defined in claim 25 wherein x1 and x2 is equal to or less than about 16.5% of W.

27. The planar magnetron as defined in claim 26 wherein said magnet means comprises NdFeB magnets.

28. The magnetron assembly as defined in claim 27 further comprising corrosion resistant insert means for attaching said magnet yoke to the backing plate wherein said backing plate comprises a substantially flat, single piece metal plate.

29. The magnetron assembly as defined in claim 28 wherein the backing plate is made of copper.

30. A planar magnetron device comprising:
a sputtering target of unitary construction having a first surface with a first perimeter, a second surface opposite said first surface, and a side surface extending between said first and second surfaces, said target extending continuously within said first, second, and side surfaces;
magnet means positioned adjacent to and adjoining the first target surface for generating a closed-loop magnetic field over the second target surface; and
a magnet yoke positioned adjacent to and adjoining said magnet means having an inner projection and outer projections that define one or more primary coolant channels that are in thermal communication with a portion of the first target surface, wherein said outer projections comprise extension means that are positioned adjacent to the side surface of the target for shunting the magnetic field therearound.

31. The planar magnetron device of claim 30 wherein said magnet yoke is of unitary construction.

32. The planar magnetron device of claim 31 wherein said magnet means comprises an inner magnet and outer magnets, said outer magnets are positioned adjacent to and along a portion of said first perimeter and wherein said inner projection is attached to said inner magnet and the outer projections are attached to said outer magnets.

* * * * *

UNITED STATES PATENT AND TRADEMARK OFFICE
CERTIFICATE OF CORRECTION

PATENT NO. : 5,407,551
DATED : April 18, 1995
INVENTOR(S) : Peter A. Sieck, Milan R. Kirs, Terry A. Trumbly It is certified that error appears in the above—identified patent and that said Letters Patent is hereby corrected as shown below:

Column 8:

At claim 5, line 26, "claim" should read --claim 4--

At claim 7, line 41, "claim" should read --claim 6--

Column 10:
At claim 25, line 19, after "said" delete "planar"

Signed and Sealed this

Twenty-second Day of August, 1995

Attest:

BRUCE LEHMAN

Attesting Officer      Commissioner of Patents and Trademarks